United States Patent [19]

Matsuda et al.

[11] Patent Number: 5,413,967
[45] Date of Patent: May 9, 1995

[54] METHOD OF MANUFACTURING SEMICONDUCTOR DEVICES

[75] Inventors: Tetsuo Matsuda, Kanagawa; Haruo Okano, Tokyo, both of Japan

[73] Assignee: Kabushiki Kaisha Toshiba, Kanagawa, Japan

[21] Appl. No.: 237,412

[22] Filed: May 3, 1994

Related U.S. Application Data

[63] Continuation of Ser. No. 883,576, May 15, 1992, abandoned.

[30] Foreign Application Priority Data

May 16, 1991 [JP] Japan .................... 3-111399

[51] Int. Cl.$^6$ .................................. H01L 21/02
[52] U.S. Cl. .............................. 437/235; 437/238; 437/240; 148/DIG. 118
[58] Field of Search .............. 437/238, 235, 249; 148/DIG. 118

[56] References Cited

U.S. PATENT DOCUMENTS

| | | | |
|---|---|---|---|
| 4,845,054 | 7/1989 | Mitchener | 437/240 |
| 4,872,947 | 10/1989 | Wang et al. | 156/643 |
| 4,894,352 | 1/1990 | Lane et al. | 437/235 |
| 5,013,691 | 5/1991 | Lory et al. | 437/238 |
| 5,051,380 | 9/1991 | Maeda et al. | 437/235 |
| 5,180,692 | 1/1993 | Ibuka et al. | 437/238 |
| 5,204,288 | 4/1993 | Marks et al. | 437/240 |
| 5,290,736 | 3/1994 | Sato et al. | 437/240 |
| 5,314,845 | 5/1994 | Lee et al. | 437/238 |

FOREIGN PATENT DOCUMENTS

| | | |
|---|---|---|
| 60-165728 | 8/1985 | Japan . |
| 62-77466 | 4/1987 | Japan . |

OTHER PUBLICATIONS

Wolf; "Silicon Processing for the VLSI Era"; vol. 1; 1986; pp. 539–551.
Webb et al., "Silicon Dioxide Films Produced by PECVD of TEOS and TMCTS".
"Properties Of Chemical Vapor Deposited Tetraethylorthosilicate Oxides: Correlation With Deposition Parameters, Annealing, and Hydrogen Concentration", A. Nguyen et al., J. Vac. Sci. Technol. B.8 (3) May/-Jun. 1990, pp. 533–538.
Very Low Temperature CVD Of SiO$_2$ Films Using Ozone And Organosilane, J. Sato et al., E.C.S. Spring Meeting, Abstract No. 9, May 1971, pp. 31–33.

*Primary Examiner*—Brian E. Hearn
*Assistant Examiner*—Trung Dang
*Attorney, Agent, or Firm*—Finnegan, Henderson, Farabow, Garrett & Dunner

[57] ABSTRACT

An organic silane compound gas and an oxidizing gas are introduced into a reaction vessel from each gas source. Further a gas containing at least one kind of halogen, for example carbon tetrafluoride, is decomposed into halogen radicals, etc., by microwave discharge, and introduced into the reaction vessel. Reaction occurs between the gases, resulting in silicon oxide films being formed on substrates in the reaction vessel.

11 Claims, 10 Drawing Sheets

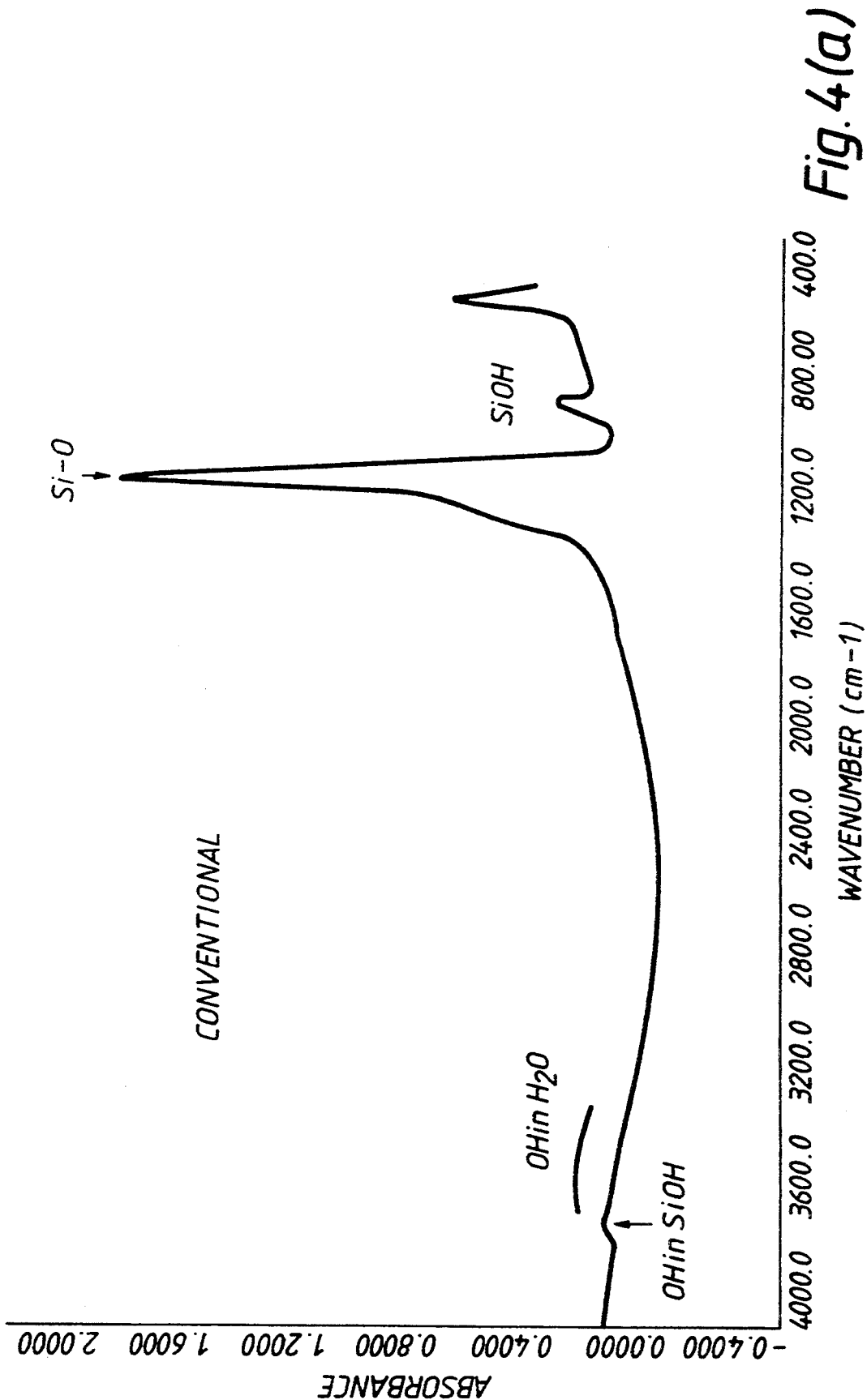

METHOD OF MANUFACTURING SEMICONDUCTOR DEVICES

This application is a continuation of application Ser. No. 07/883,576 filed May 15, 1992, now abandoned.

BACKGROUND OF THE INVENTION

1. Field of the Invention

This invention relates to a method of manufacturing semiconductor devices, particularly a method of forming films such as silicon oxide films in large scale integrated circuits (LSI).

2. Description of the Related Art

Chemical vapor deposition (CVD) method is a technology of forming thin films on substrates, which have been used widely in the semiconductor device industry.

Recently in this technology, a CVD method using an organic silane compound gas and an ozone gas is well-known as a method of forming thin films of silicon oxide.

But this method has several problems. Particularly, it serious problem that silicon oxide films formed by this method absorb water ($H_2O$) during the deposition of the films. This water is exhausted in the steps in the process of manufacturing semiconductor devices, and if conductive layers are formed on the silicon oxide films, serious problems, such as disconnection of the conductive layers, failure of contact between the conductive layers, and so on, are caused by the exhaustion of the water. Furthermore, the water absorbed into the silicon oxide films causes an increase of the dielectric constant of the silicon oxide films, and thus the reliability of the silicon oxide films as insulating layers is reduced.

The absorption of water vapor into silicon dioxide films formed by CVD methods is reported in Ann Marie Nguyen and Shyam P. Murarka: *Properties of chemical vapor deposited tetraethylorthosilicate oxides: Correlation with deposition parameters, annealing, and hydrogen concentration* (Journal of Vacuum Science Technology B8(3), May/June 1990).

As described above, the conventional process of forming silicon oxide films by CVD methods is encountered with a problem that water is absorbed into the films and that the reliability of semiconductor devices is seriously affected.

SUMMARY OF THE INVENTION

One object of this invention is to provide a method of manufacturing reliable semiconductor devices, including the process of forming silicon oxide films.

A further object of this invention is to provide a method of manufacturing semiconductor devices, comprising the process of forming silicon*oxide films into which water is not absorbed.

Moreover, a further object of this invention is to provide a method of manufacturing semiconductor devices in which conductive layers on silicon oxide films have high reliability.

In accordance with the present invention, the forgoing objects, among others, are achieved by providing a method of manufacturing semiconductor devices, comprising the steps of: arranging at least one substrate in a reaction vessel; supplying an organic silane compound gas, an oxidizing gas, and a gas including at least one kind of halogen to the reaction vessel; and forming a silicon oxide film on the substrate by heating an inner portion of the reaction vessel to a predetermined temperature.

There has also been provided, in accordance with yet another aspect of the present invention, a method of manufacturing semiconductor devices, comprising the steps of: arranging at least one substrate in a reaction vessel; supplying an organic silane compound gas, an oxidizing gas, and a gas including at least one of kind of halogen to the reaction vessel; and forming a silicon oxide film on the substrate by generating a discharge of energy in the reaction vessel.

There has still further been provided, in accordance with yet another aspect of the present invention, a method of manufacturing semiconductor devices, further comprising a step of forming a conductive layer on the silicon oxide film, in addition to the steps described above.

Other objects, features, and advantages of the present invention will become apparent from the following detailed description. It should be understood, however, that the-detailed description and specific examples, while indicating preferred embodiments of the invention, are given by way of illustration only, since various changes and modification within the spirit and scope of the invention will become apparent to those skilled in the art from this detailed description.

BRIEF DESCRIPTION OF THE DRAWINGS

Other objects and many of the attendant advantages of this invention will be readily appreciated as the same becomes better understood by reference to the following detailed description when considered in connection with the accompanying drawings, in which like reference characters designate the same or similar parts throughout the figures thereof and wherein;

FIGS. 4(a) and 4(b) show the bond states of silicon in the surface of the silicon oxide films formed using the apparatus shown in FIG. 1;

DESCRIPTION OF THE PREFERRED EMBODIMENTS

This invention will now be explained by way of preferred embodiments with reference to the accompanying drawings.

Figure 1:
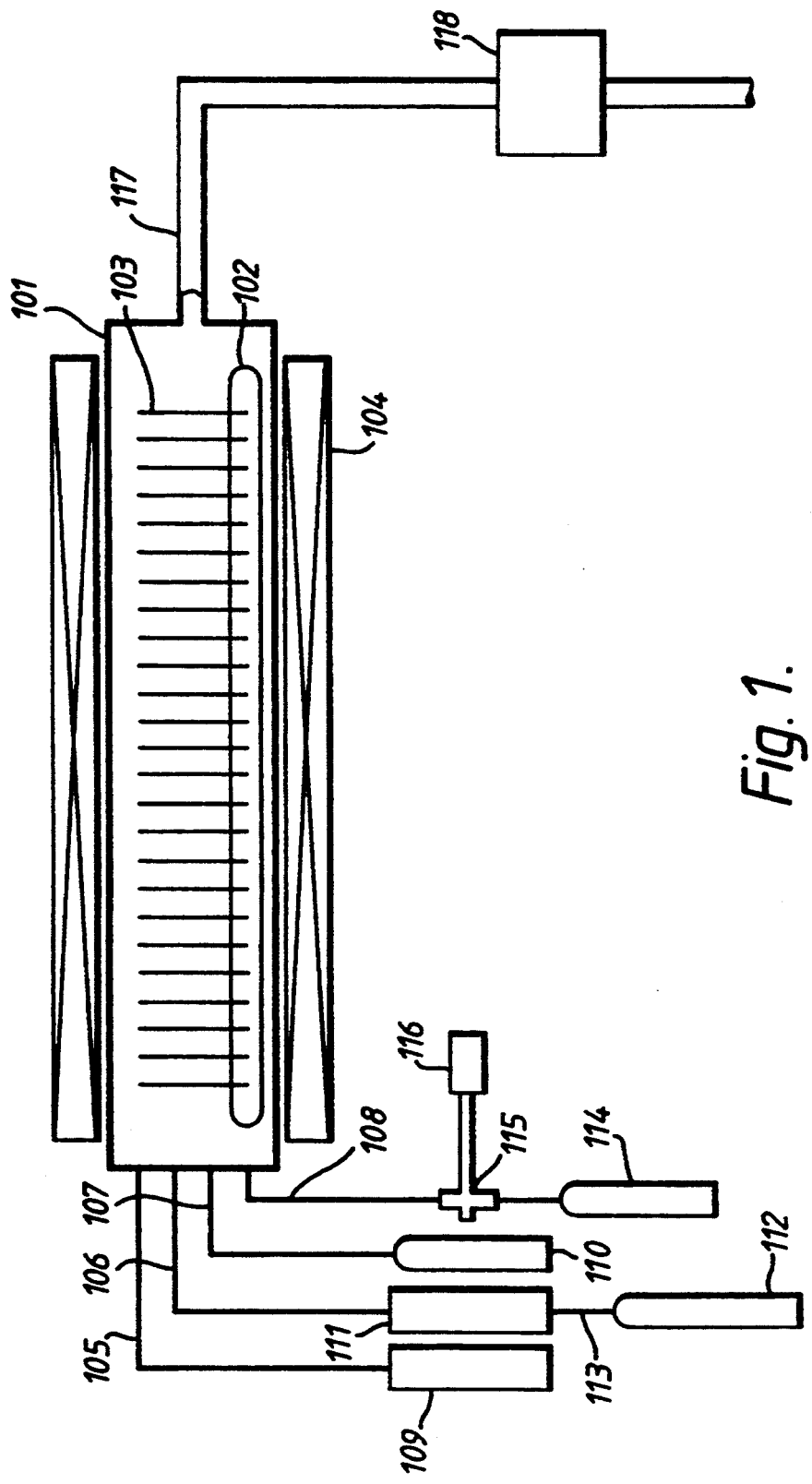
FIG. 1 shows a structure of a barrel type film forming apparatus according to the first embodiment of this invention.

FIG. 1 shows a structure of a barrel type film forming apparatus according to the first embodiment of this invention and employing a reduced pressure CVD method. It will now be explained how to form silicon oxide films on silicon monocrystal wafers.

A reaction vessel 101 is made of quartz, and a quartz boat 102 is provided in the inner portion of this reaction vessel 101. A great number of silicon wafers 103 are arranged on quartz boat 102. A resistance heater 104 surrounds reaction vessel 101, and silicon wafers 103 are heated at a temperature such as 350° C. by resistance heater 104.

One end of each of gas introducing tubes 105, 106, 107, and 108 is connected to one end portion of reaction vessel 101. The other ends of gas introducing tubes 105 and 107 are fixed to an organic silane compound (for example tetraethylorthosilicate, abbreviated as TEOS) gas source 109 and an inert gas (for example helium gas) source 110, respectively. The other end of gas introducing tube 106 is fixed to an ozonizer 111. Ozonizer 111 is in turn fixed to an oxygen gas source 112 through a gas introducing tube 113. Oxygen gas is introduced into ozonizer 111 through gas introducing tube 113, and ozone gas, which is an oxidizing gas, is formed from the oxygen gas by silent discharge in ozonizer 111, to which for example an electric power of 800W is applied.

Gas introducing tube 108 is fixed to a gas source 114, in which a gas including at least one kind of halogen (for example carbon tetrafluoride ($CF_4$) gas) is contained. A microwave conducting tube 115 is provided around gas introducing tube 108 between reaction vessel 101 and gas source 114. A microwave power generator 116, to which for example an electric power of 100W is applied in order to generate microwaves, is connected to microwave conducting tube 115. Microwaves generated in microwave power generator 116 are conducted in microwave conducting tube 115 and cause generation of gas plasma in gas introducing tube 108.

The flow rate and pressure of each gas described above are control led by a flow rate control apparatus and a pressure control valve, respectively, before each gas is introduced into reaction vessel 101. These flow rate control apparatus and pressure control valves are omitted in FIG. 1.

An exhaust tube 117 is connected to the other end portion of reaction vessel 101. A rotary pump 118 is fixed to exhaust tube 117, and the pressure in reaction vessel 101 is held at a low pressure, for example 5 torr, by rotary pump 118.

It will now be explained how silicon oxide films have been formed by using this apparatus in accordance with the first embodiment of the invention. First of all, the interior of reaction vessel 101, in which sill con wafers 103 are arranged, was exhausted to 5 torr, and silicon wafers 103 were heated to a temperature of approximately 350° C.

Next, TEOS gas and oxygen gas and helium gas were introduced into reaction vessel 101 at flow rates of 100 cc/min, 10 liters/min, and 20 liters/min, respectively. Oxygen gas was ozonized by silent discharge of ozonizer 111, in which the pressure was approximately 2 arm, before being introduced into reaction vessel 101. In this step, 5% of the oxygen gas was ozonized. Further, carbon tetrafluoride gas was introduced into gas introducing tube 108 at a flow rate of 20 cc/min. The carbon tetrafluoride gas was excited to gas plasma by microwave discharge in the inner portion of microwave conducting tube 115, and thus decomposed into components and radicals including fluorine radicals. The fluorine radicals formed in this decomposition process were introduced into react ion vessel 101.

Under the conditions described above, silicon oxide films were formed on silicon wafers 108 with a thickness of about 300 nm. The reaction time of this film formation was about 3 minutes. Further, for the purpose of comparison, using the apparatus shown in FIG. 1, silicon oxide films were formed on silicon wafers without introducing carbon tetrafluoride gas. The reaction time of this film formation was also about 3 minutes, and silicon oxide films were formed on silicon wafers with a thickness of about 300 nm.

Next, in order to evaluate the quantity of water absorbed in the silicon oxide films, the following method was separately practiced for the samples prepared with and without carbon tetrafluoride. A sample, on which the silicon oxide film was formed by the method described above, was placed on a sample holder in a vacuum chamber made of quartz, and heated by a heater buried in the sample holder. The vacuum chamber was connected to a turbo-molecular pump and a mass analyzer through valves. With the heater off (in this case the temperature of the estimated sample was approximately 25° C.), the pressure the vacuum chamber was fixed to about $5 \times 10^{-8}$ torr. The sample was then heated to measuring temperatures, up to approximately 550° C. at a heating speed of 5° C./min, and water was exhausted into the vacuum chamber by this heating. The exhausted water was introduced into the mass analyzer, and the quantity of this water was evaluated by detecting the peak of water of mass number 18 ($H_2O$) with the mass analyzer.

Figure 2:
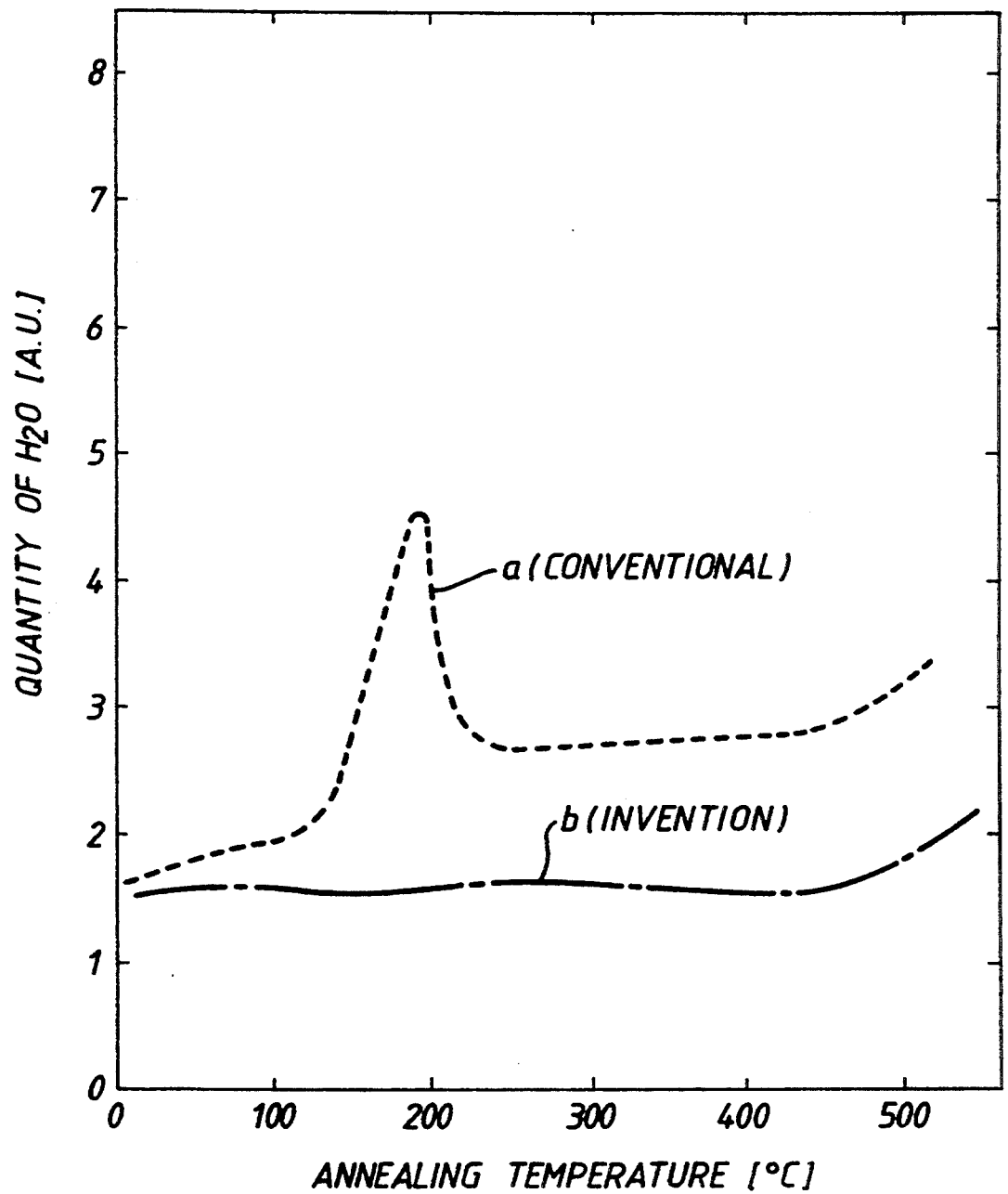
FIG. 2 shows the quantity of water exhausted from silicon oxide films formed using the apparatus shown in FIG. 1.

FIG. 2 shows the result of this evaluation. As shown in FIG. 2, for the sample prepared under the condition carbon tetrafluoride gas wasn't supplied (curve a), a large quantity of water was exhausted at the sample temperature of approximately 150° to 200° C. Further, the quantity of the exhausted water increased with the sample temperature at more than 200° C. On the other hand, under the condition that carbon tetrafluoride gas was supplied (curve b), the quantity of the exhausted water decreased sharply at all temperatures.

From these results, it is understood that, for silicon oxide films formed according to this invention, the quantity of the water which is exhausted from silicon oxide films, can be substantially reduced, when the silicon oxide films are heated.

There will now be explained a reason for which this effect is obtained according to this invention. Before the explanation of the effect, the water ($H_2O$)-formation mechanism is described using the reaction between TEOS and ozone as one example. The reaction between TEOS and ozone is as follows.

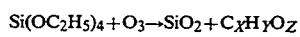

$$Si(OC_2H_5)_4 + O_3 \rightarrow SiO_2 + C_xH_yO_z$$

In this reaction formula, $C_xH_yO_z$ is $H_2O$, $CO$, $CO_2$, $C_2H_5OH$, $C_2H_5OC_2H_5$, $C_2H_6$, $CH_4$, $CH_3COOH$ etc.. In this way, water is formed in gaseous phase by this reaction process.

Next, gas species in gaseous phase, which existed during the film formation, was investigated by using a mass analyzer, which was attached to reaction vessel 101.

Figure 3A:
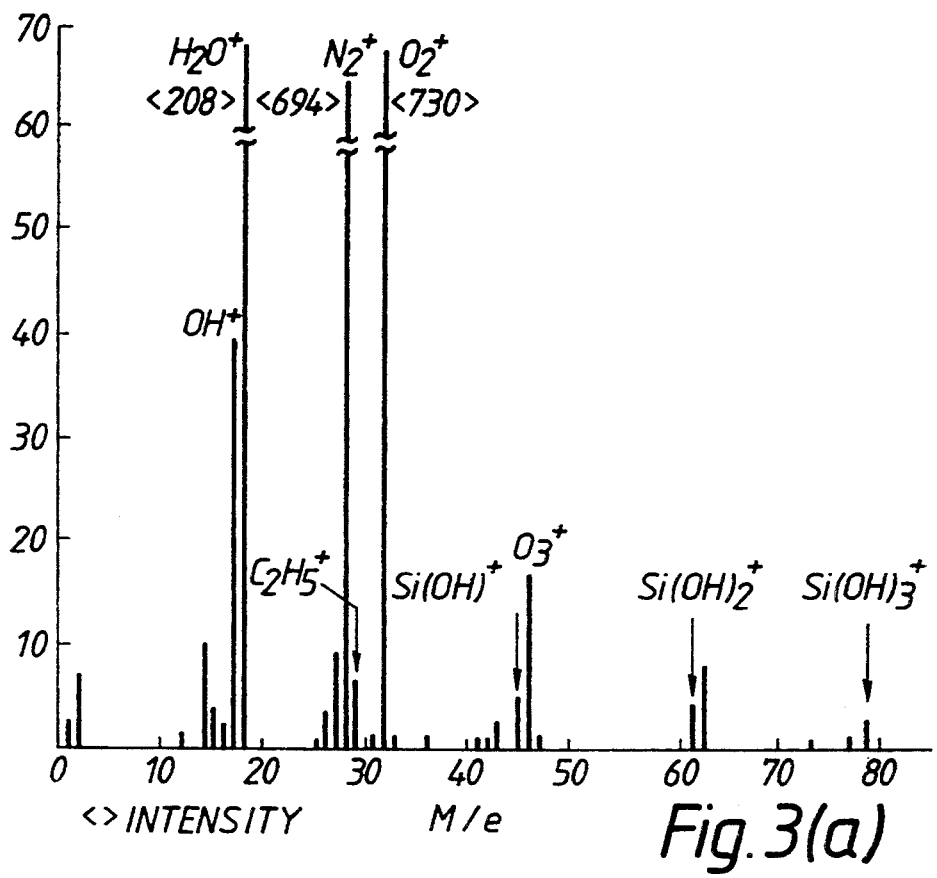
FIGS. 3(a) and 3(b) show gas species in gaseous phase, which exist during the film formation by using the apparatus shown in FIG. 1.
Figure 3B:
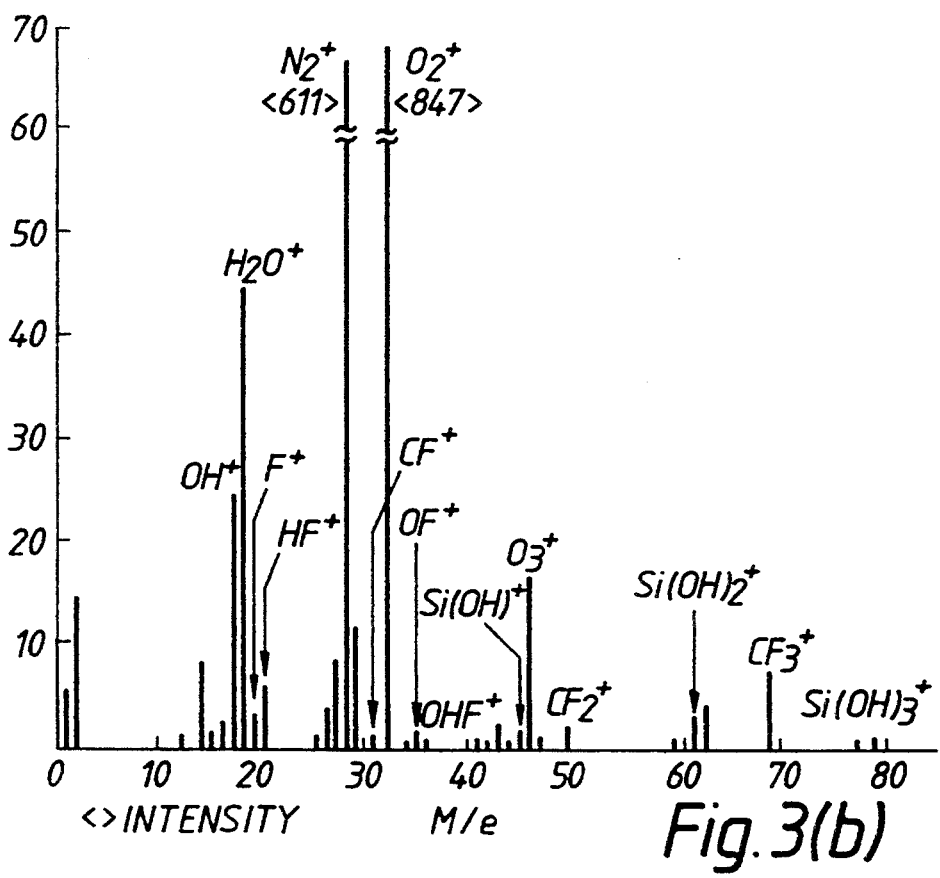

FIGS. 3(a) and 3(b) show the results of this investigation. In FIGS. 3(a) and 3(b), mass spectrums of the gas species in gaseous phase is shown. Under the condition that carbon tetrafluoride gas was not supplied (FIG. 3(a)), the peak of $H_2O^+$ was very high, and from this result, a large quantity of water was identified in the gaseous phase. On the other hand, under the condition that carbon tetrafluoride gas was supplied (FIG. 3(b)), the peak of $H_2O^+$ was much lower than the case shown in FIG. 3(a), and the quantity of water proved to be reduced sharply. Further, the peaks of F, HF, and OF appeared at mass numbers of 19, 20, and 35, respectively.

The above-mentioned results establish the following condition. Namely, fluorine radicals, formed by microwave discharge of carbon tetrafluoride gas, react with water ($H_2O$), which is formed in the gaseous phase by the reaction between TEOS and ozone. By this reaction, HF and OF are formed, and are then exhausted outside the reaction vessel. As a result, the water is not absorbed into the formed silicon oxide films, and thus the exhaustion of the water from the silicon oxide films does not substantially occur.

Figure 4B:
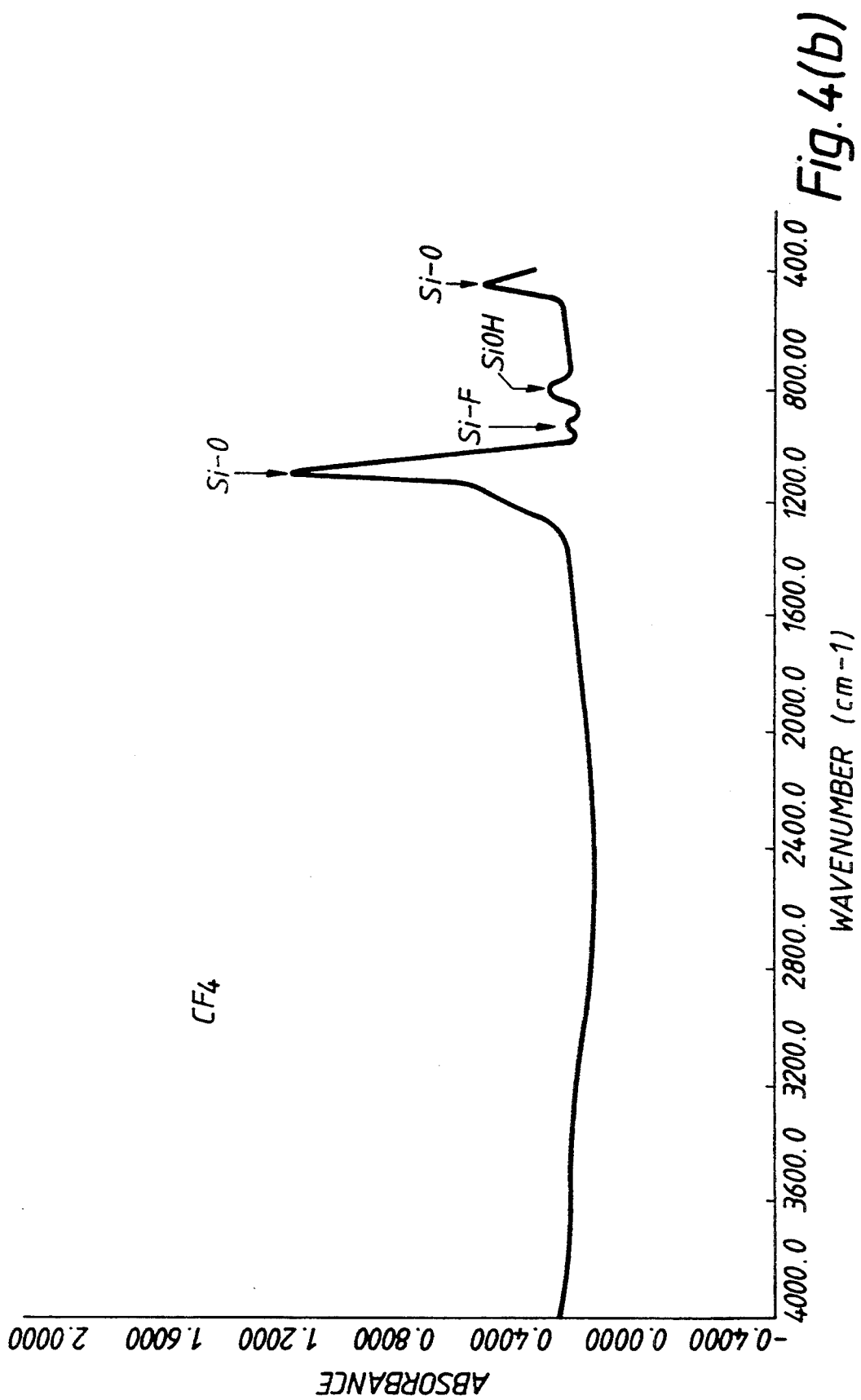

Furthermore, in order to clarify another reason, for which the effect described above is obtained, the bond states of silicon in the surface of the silicon oxide films were investigated using FTIR (Fourier Transformation Infrared). FIG. 4(a) and 4(b) show the results of this investigation. As shown in FIG. 4(a), under the condition that carbon tetrafluoride gas was not supplied), the peak of the bond of Si-OH was significant. On the other hand, under the condition that carbon tetrafluoride gas was supplied (FIG. 4(b)), the peak of the bond of Si-OH decreased and the peak of the bond of Si-F appears.

From these results, the following conditions are established. Namely, the bond of Si-OH is formed in the silicon oxide films. The OH (hydroxyl group) in the bond of Si-OH attracts strongly the $H_2O$ (water) molecule in the gaseous phase by hydrogen bond. On the other hand, according to the present invention, the hydroxyl groups are substituted by the fluorine radicals formed in the above-mentioned method. The attraction, which the bond of Si-F has for $H_2O$ molecule, is very weak, and thus the water is not absorbed into the silicon oxide film during or after the film formation. Therefore, the exhaustion of the water from the silicon oxide film does not occur.

Next, there will be described the formation of conductive layers on the silicon oxide films formed by the present invention.

In the formation process of conductive layers on silicon oxide films, which is formed by conventional CVD methods, the serious problems are as follows.

For example, when conductive layers, such as aluminum layers, are formed on the silicon oxide films, the water is exhausted from the silicon oxide films, and causes disconnection of the conductive layers. Further, when metal layers are formed by a sputtering method over contact holes or via holes opened in the silicon oxide films, under which the conductive layers are formed, the temperature of the silicon oxide films increases, and thus the water is exhausted from the silicon oxide films. This water oxidizes the metal layers. Therefore, failure of contact between the conductive layers and the metal layers is caused.

According to the present invention, conductive layers, such as aluminum layers, can be formed on the silicon oxide films without disconnecting, because the water is not exhausted from the silicon oxide films. Moreover, metal layers can be formed in contact holes or via holes, opened in the silicon oxide films, without failure of contact for the same reason.

Furthermore, because the water is not absorbed into the silicon oxide films, and increase of the dielectric constant of the silicon oxide films does not occur, and thus the reliability of the silicon oxide films as insulating layers can be maintained.

In this way, reliability of semiconductor devices can be improved remarkably by the present invention.

Still in the first embodiment according to this invention, in order to form fluorine radicals, only carbon tetrafluoride gas was decomposed by microwave. Alternatively, after oxygen gas is mixed with carbon tetrafluoride gas, fluorine radicals may be formed in microwave conducting tube 115 by the following reaction.

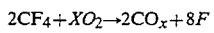

$$2CF_4 + XO_2 \rightarrow 2CO_x + 8F$$

Figure 5:
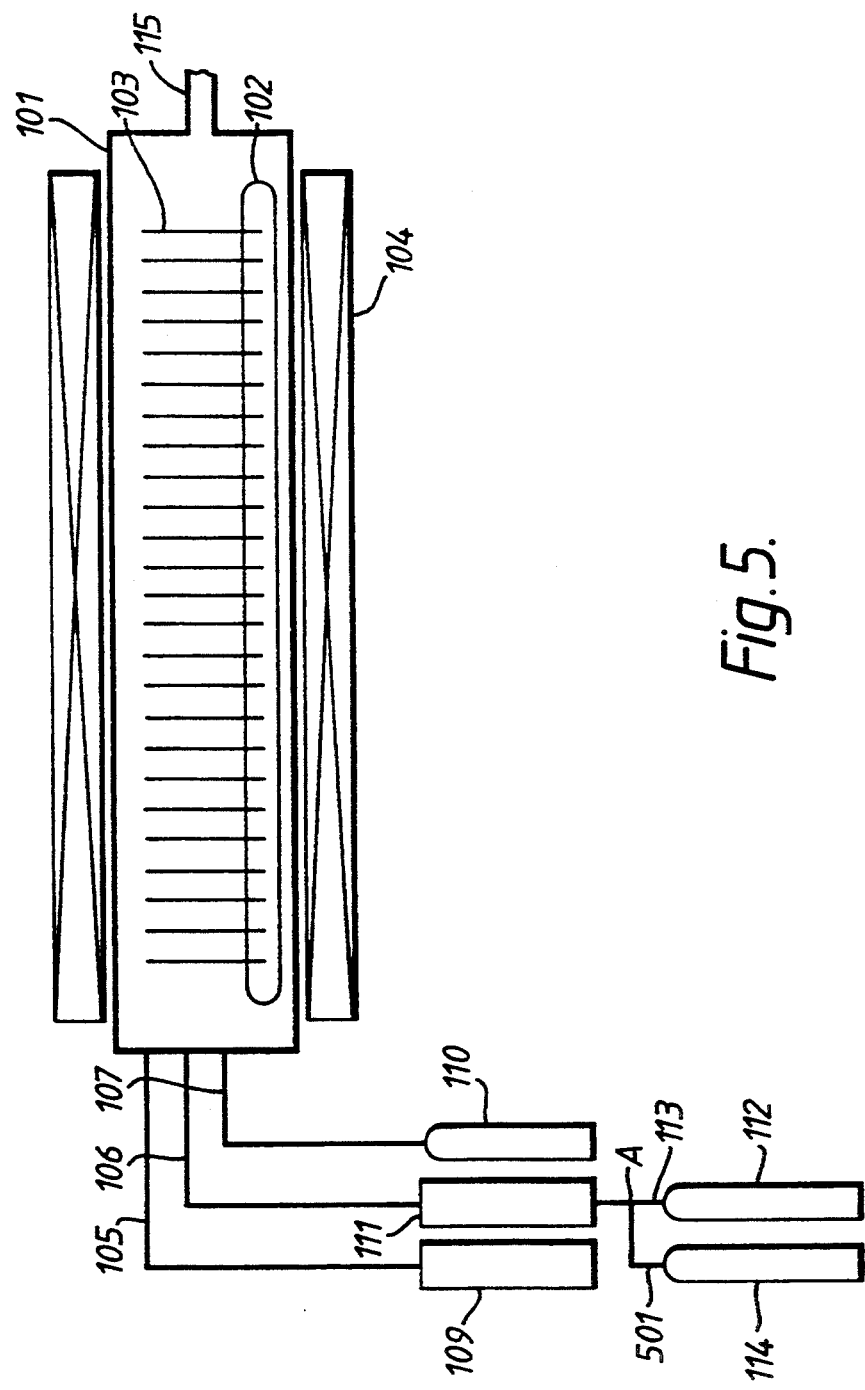
FIG. 5 shows a structure of a barrel type film forming apparatus according to the second embodiment of this invention.

FIG. 5 shows a structure of a barrel type film forming apparatus according to the second embodiment of this invention and employing a reduced pressure CVD method.

The fundamental structure of this apparatus is almost the same as the structure of the one shown in FIG. 1. This apparatus is different from the one shown in FIG. 1 with respect to the following features.

Gas source 114, in which a gas including at least one kind of halogen (for example nitrogen trifluoride gas) is contained, is connected to gas introducing tube 113 through gas introducing tube 501. In this structure, oxygen gas from gas source 112 and gas including at least one kind of halogen are mixed with each other at point A, which is a connection portion between gas introducing tube 113 and gas introducing tube 501. Mixed gas is introduced into ozonizer 111, to which for example an electric power of 800W is applied. Alternatively, both the gas including at least one kind of halogen and the oxygen gas can be simultaneously introduced into ozonizer 111.

It will now be explained how silicon oxide films have been formed by using the apparatus in accordance with the second embodiment of the invention. First of all, the interior of reaction vessel 101, in which silicon wafers 103 were arranged, was exhausted to 500 torr, and silicon wafers 103 were heated to a temperature of approximately 390° C.

Next, TEOS gas and helium gas were introduced into reaction vessel 101 at flow rates of 100 cc/min and 20 liters/min, respectively. Further, oxygen gas and nitrogen trifluoride gas were mixed and introduced into ozonizer 111 at flow rates of 10 liters/min, 50 cc/min, respectively. Then ozone gas and fluorine radicals were formed simultaneously from the oxygen gas and the nitrogen trifluoride ($NF_3$) gas by silent discharge in ozonizer 111, in which the pressure was approximately 2 atm. In this step, 5% of the oxygen gas was ozonized. The ozone gas and the fluorine radicals were introduced into reaction vessel 101.

Under the condition described above, silicon oxide films were formed on silicon wafers 103 with a thickness of about 1000 nm. The reaction time of this film formation was about 3 minutes. Further, as a comparative example, using the apparatus shown in FIG. 5, silicon oxide films were formed on silicon wafers without introducing nitrogen trifluoride gas. The reaction time of this film formation was also about 3 minutes, and silicon oxide films were formed on silicon wafers with a thickness of about 1100 nm.

Next in order to evaluate the quantity of water absorbed in the silicon oxide films, the method described above in connection with the first embodiment of the invention was practiced.

Figure 6:
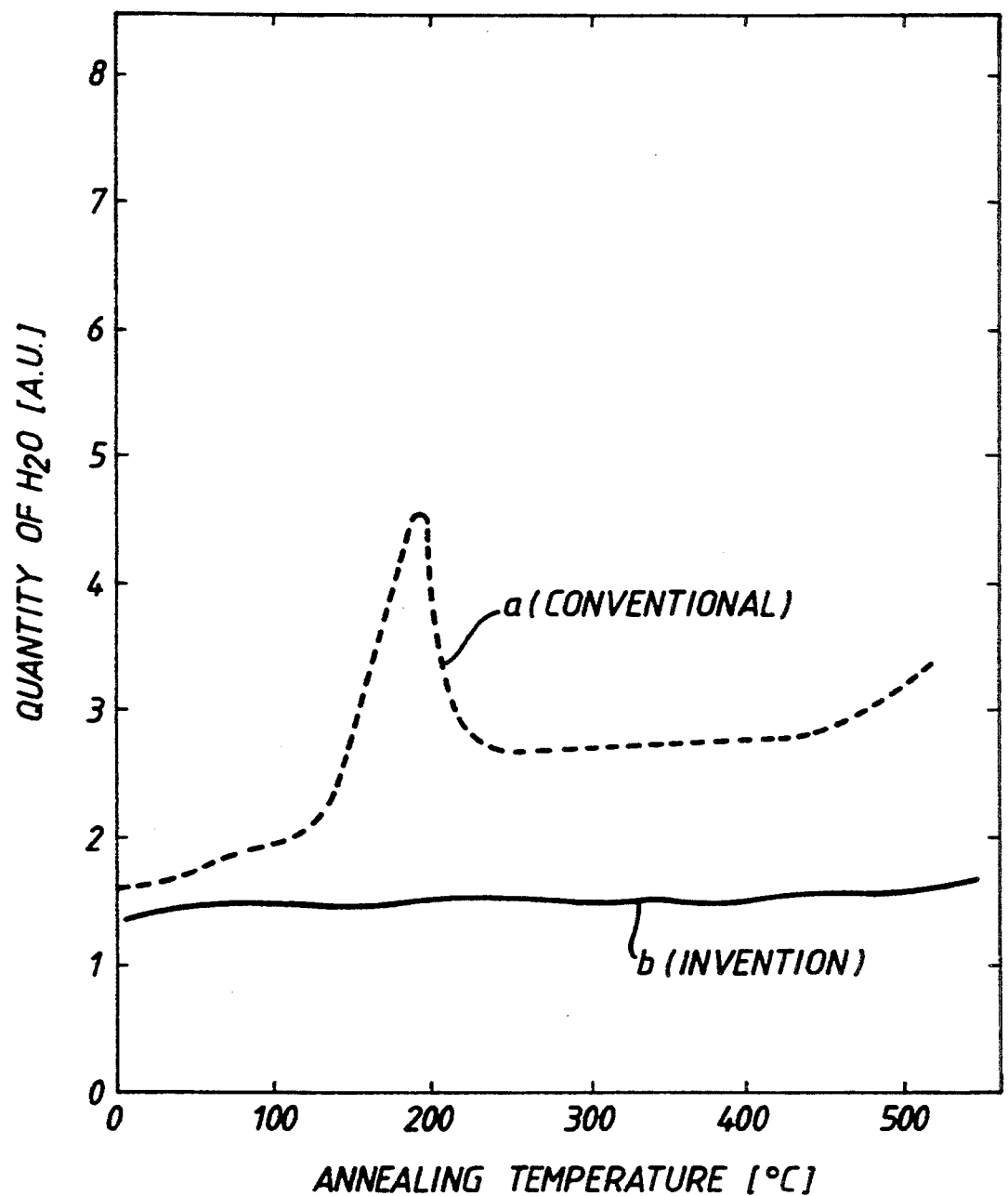
FIG. 6 shows the quantity of water exhausted from silicon oxide films formed using the apparatus shown in FIG. 5.

FIG. 6 shows the result of this evaluation. As shown in FIG. 6, under the condition that nitrogen trifluoride gas was not supplied (curve a), a large quantity of water was exhausted at the sample temperature of approximately 150° to 200° C. Further, the quantity of the exhausted water increased with the sample temperature at more than 200° C. On the other hand, under condition that nitrogen trifluoride gas was supplied (curve b), the quantity of the exhausted water decreased sharply throughout the temperature range.

From these results, it is understood that, for silicon oxide films formed according to this invention, the quantity of the water, which is exhausted from silicon oxide films, can be substantially reduced, when the silicon oxide films are heated.

Therefore, reliability of semiconductor devices can be improved remarkably by this embodiment, like the first embodiment of the present invention.

In the embodiments described above, in order to form halogen radicals from a gas including at least one kind of halogen, methods according to discharge, such as microwave discharge or silent discharge, were used. however, methods of forming halogen radicals are not limited to the above described methods. For example, the discharge described above may be effected by a discharge of either direct current or alternating current. Further, a method of heating gas including at least one kind of halogen may be used. This method will be explained below.

TEOS gas and helium gas were introduced into reaction vessel 101 at flow rates of 100 cc/min and 20 liters min, respectively. Oxygen gas was introduced into reaction vessel 101 at a flow rate of 10 liters/rain, after being ozonized in part by ozonizer Ill. Further, chlorine trifluoride gas was introduced into reaction vessel 101 directly at a flow rate of 100 cc/min. The reaction temperature was 380° C., and the pressure in reaction vessel 101 was 500 tort. Under these conditions, silicon oxide films were formed on silicon wafers 103 arranged in reaction vessel 101 with a thickness of about 1000 nm. The reaction time of this film formation was about 3 minutes. In this reaction, the chlorine trifluoride gas was decomposed into fluorine radicals, chlorine radicals, etc., by only the heating for the reaction.

According to this method, the quantity of the water, which is exhausted from the silicon oxide films, can be substantially reduced, when the silicon oxide films are heated.

Therefore, reliability of semiconductor devices can be improved remarkably by this method, like the first embodiment of the present invention.

In this method, other inter-halogen compound gases, for example chlorine fluoride gas, iodine pentafluoride gas, and iodine trichloride gas, etc., also can be used. Moreover, a gas of a compound comprising a halogen and a noble gas element, such as argon Fluoride, xenon fluoride, etc., also can be used.

Figure 7:
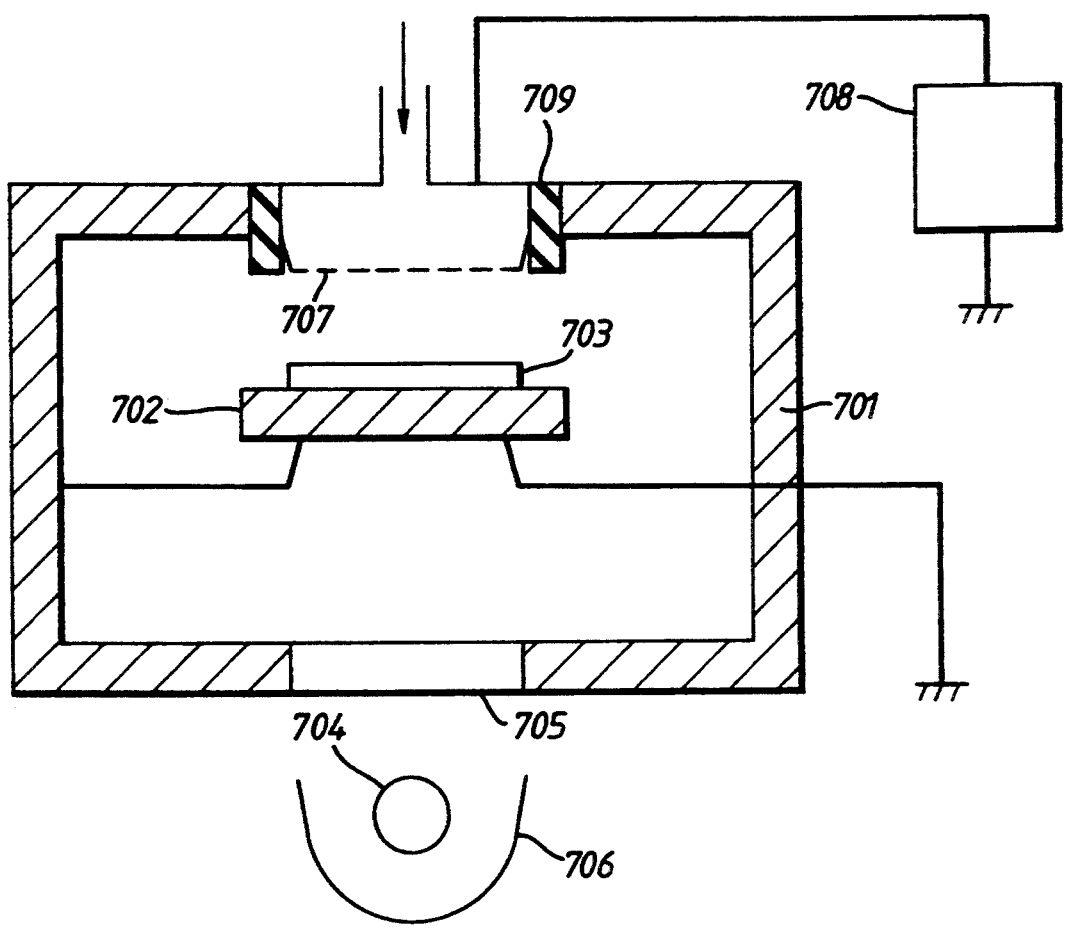
FIG. 7 shows a structure of a single wafer type film-forming apparatus according to the third embodiment of this invention.

FIG. 7 shows a structure of a single wafer type film-forming apparatus according to the third embodiment of this invention and employing a plasma enhanced CVD method.

In a reaction vessel 701, a susceptor 702 is provided horizontally, and a single wafer 703 is set on this susceptor 702. Further an infrared lamp 704 is provided under reaction vessel 701, and infrared is irradiated from infrared lamp 704 to susceptor 702 through a window 705, which is provided at a bottom portion of reaction vessel 701. Susceptor 702 is heated by the infrared, and wafer 703 is heated by the heat from susceptor 702, A reflector 706 reflects the infrared from infrared lamp 704, and concentrates the infrared on susceptor 702.

An organic silane compound (for example TEOS) gas, an oxidizing gas (for example oxygen gas), a gas including at least one kind of halogen (for example nitrogen trifluoride), and an inert gas (for example helium gas) are mixed outside reaction vessel 701, and the mixed gas is introduced into reaction vessel 701 through a gas injector 707, which is fixed to an upper portion of reaction vessel 701. A radio frequency (RF) generater 708 generates radio frequency (RF) power, and the generated RF power is applied between susceptor 702 and gas injector 707, which constitute an anode and a cathode, respectively. An insulator 709 is provided between reaction vessel 701 and gas injector 707 for the insulation.

It will now be explained how a silicon oxide film has been formed by using the apparatus in accordance with the third embodiment of the invention. First of all, the interior of reaction vessel 701, in which silicon wafer 703 was set, was exhausted to 9 torr, and silicon wafer 703 was heated to a temperature of approximately 365° C. by infrared lamp 704. Next, TEOS gas, oxygen gas, nitrogen trifluoride gas, and helium gas were introduced into reaction vessel 701 at flow rates of 50 cc/min, 460 cc/min, and 50 cc/min, respectively. Alternatively the nitrogen trifluoride gas can be introduced at a flow rate of 150 cc/min. Furthermore, RF power (13.56 MHz) was applied between susceptor 702 and gas injector 707 at a power of 485W (in this case, the density of power was 2.4W/cm$^2$.).

In this reaction, nitrogen trifluoride gas was excited to gas plasma by the RF power, and thus decomposed into fluorine radicals, etc. Under the conditions described above, a silicon oxide film was formed on silicon wafer 703 with a deposition rate of about 800 nm/min.

In this embodiment of the present invention, the quantity of water, which is exhausted from a silicon oxide film formed by CVD methods, can be substantially reduced, when the silicon oxide film are heated.

Therefore, reliability of semiconductor devices can be improved remarkably by this embodiment, like the first embodiment of the present invention.

In the present invention, the following gases can also be employed as gases including at least one kind of halogen, instead of the gases described above. Namely, fluorine gas ($F_2$), chlorine gas ($Cl_2$), bromine gas ($Br_2$), iodine gas ($I_2$), sulfur hexafluoride ($SF_6$), and monohydrocarbontrifluoride ($CHF_3$) can also be used.

Furthermore, as an organic silane compound gas other than TEOS, a tetramethyl silane ($Si(CH_3)_4$) gas, a hexamethyl disiloxane (($CH_3)_6OSi_2$) gas, a 1,3,5,7-tetramethyl cyclo tetrasiloxane ((($CH_3)H)_4O_4Si_4$) gas, or other similar gases may also be used. Still, Further, as an oxidizing gas, a gas other than oxygen gas of ozone gas, which has an oxidative action, may also be used.

Moreover, in the embodiments described above, films consisting of silicon oxide are formed. But silicon oxide films, including at least one element selected from the group consisting of boron, phosphorus, and arsenic, can be formed on substrates.

For instance, as an example of this method, a method using TEOS gas, oxygen gas, phosphine gas, and diborane gas will be described herein.

TEOS gas, phosphine (PH$_3$) gas, and diborane (B$_2$H$_6$) gas were introduced into reaction vessel 101 at flow rates of 40 cc/min, 20 cc/min, and 50 cc/min, respectively. Further, oxygen gas and carbon tetrafluoride gas were introduced into ozonizer 111 at flow rates of 7.5 liters/min and 20 cc/min, respectively. Oxygen gas was ozonized in part by silent discharge of ozonizer 111, and then introduced into reaction vessel 101. In this case, oxygen gas of 900 cc/min changed into ozone gas of 600 cc/min. Carbontetrafluoride gas was excited to gas plasma by the silent discharge, and thus decomposed into fluorine radicals, etc.. The fluorine radicals were introduced into reaction vessel 101. The reaction temperature was 360° C., and the pressure in reaction vessel 101 was 300 torr. Under these conditions, silicon oxide films, including boron of 6 vol % and phosphorus of 7 vol %, were formed on wafers 103 in reaction vessel 101 with a thickness of 300 nm. The reaction time was 3 minutes. According to this method, the quantity of water, exhausted from the silicon oxide films, can be substantially reduced, when the silicon oxide films are heated.

Therefore, reliability of semiconductor devices can be improved remarkably by this method, like the first embodiment of the present invention.

In accordance with the methods described above, a thermal CVD method was employed for the film formation. However, a plasma-enhanced CVD method may also be employed, and using the method mentioned in the third embodiment according to this invention, silicon oxide film can be formed on substrate.

Furthermore, gases used in this method may include the following gases. For example, trimethyl borate (B(OCH$_3$)$_3$) gas, triethyl borate (B(OC$_2$H$_5$)$_3$) gas, trimethyl phosphate (P(OCH$_3$)$_3$) gas, triethyl phosphate (P(OC$_2$H$_5$)$_3$) gas, arsine (AsH$_3$) gas, and triethoxy arsine (As(OC$_2$H$_5$)$_3$) gas, etc. can be used.

In this way, gases used and films formed in the present invention are not limited to the above-mentioned embodiments. Namely, this invention can be applied to the CVD methods using various gases, so long as a formed silicon oxide film is prevented from absorbing water formed and/or left in the atmosphere.

As used herein, the term "substrate" broadly refers to a semiconductor wafer, for example a silicon substrate, a gallium arsenide substrate, etc., encountered at any point during a process for manufacturing a semiconductor device. Further, an insulator substrate, for example a quartz substrate, a glass substrate, etc., can be used as the substrate.

Still, silicon oxide films formed by the present invention are desired to contain fluorine of predetermined contents. In order to determine this preferable fluorine contents contained in the silicon oxide films, next experiment was carried out.

Using the method described in the first embodiment of the present invention, silicon oxide films were formed employing TEOS gas, oxygen gas, and CF$_4$ gas. The condition of this film formation process was almost the same as that of the first embodiment except for changing the flow rate of the CF$_4$ gas. The contents of fluorine contained in the silicon oxide films were determined by FTIR. Namely, silicon oxide films containing fluorine of various predetermined contents (standard samples) were prepared. A correlation curve showing a relation between the fluorine contents of the standard samples and peaks of Si-F bond in the standard samples was drawn, and by reading values of fluorine contents corresponding to peaks of Si-F bond in the silicon oxide films formed by the present invention, fluorine contents to be required could be determined. Further, using the apparatus with the mass analyzer described above, the quantities of water exhausted from the silicon oxide films, which contained fluorine of various contents, were investigated.

Figure 8:
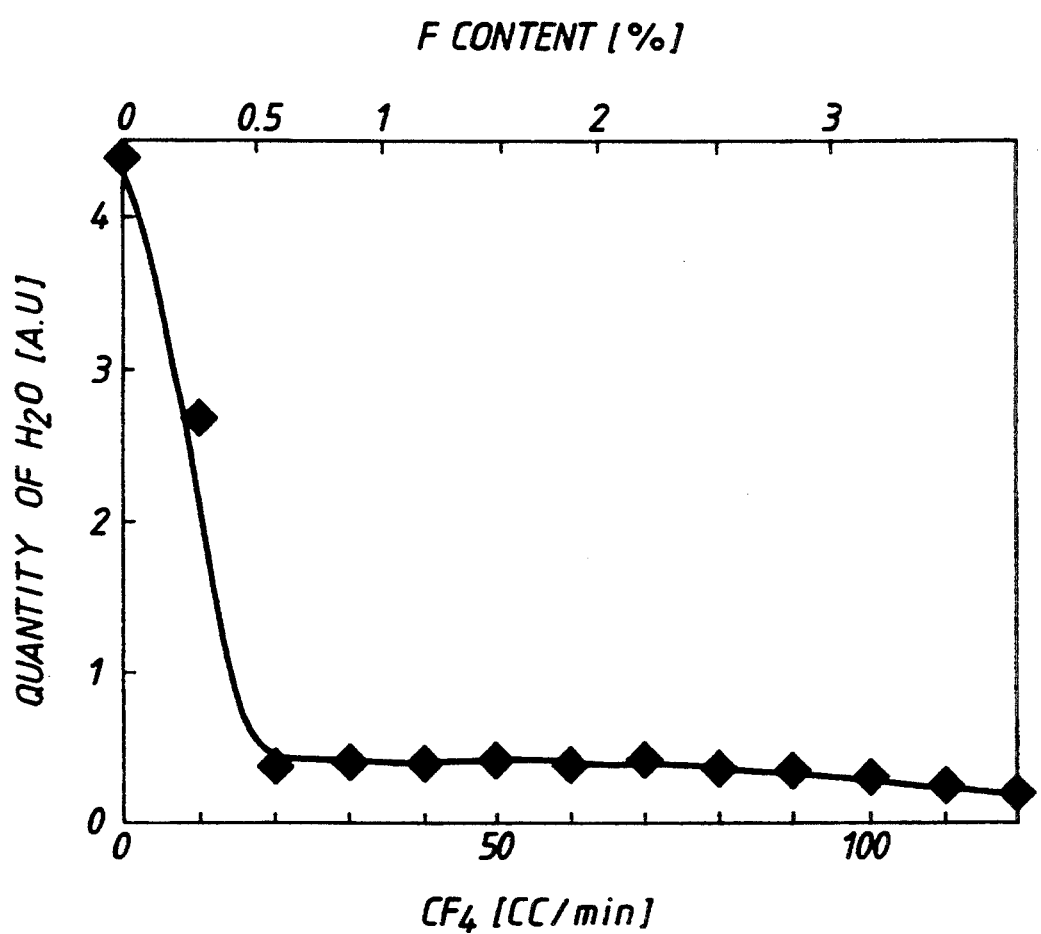
FIG. 8 shows a relation between a $CF_4$ flow rate (fluorine content (%) in silicon oxide film) and a quantity of $H_2O$ (arbitrary unit).

FIG. 8 shows a relation between a CF$_4$ flow rate (fluorine content (vol %) in silicon oxide film) and a quantity of H$_2$O (arbitrary unit).

when a fluorine content was smaller than 0.5 vol %, quantity of water increased outstandingly. From this result, it can be considered that the fluorine content is preferably not less than 0.5 vol % in order that the effect of fluorine is obtained.

Further, the silicon oxide films containing various fluorine contents, described above, were etched by buffered hydrofluoric acid (water (H$_2$O): hydrofluoric acid (HF)=50:1), which is abbreviated as BHF. The temperature of this etching process was the room temperature, and thus etching rates of the silicon oxide films were measured.

Figure 9:
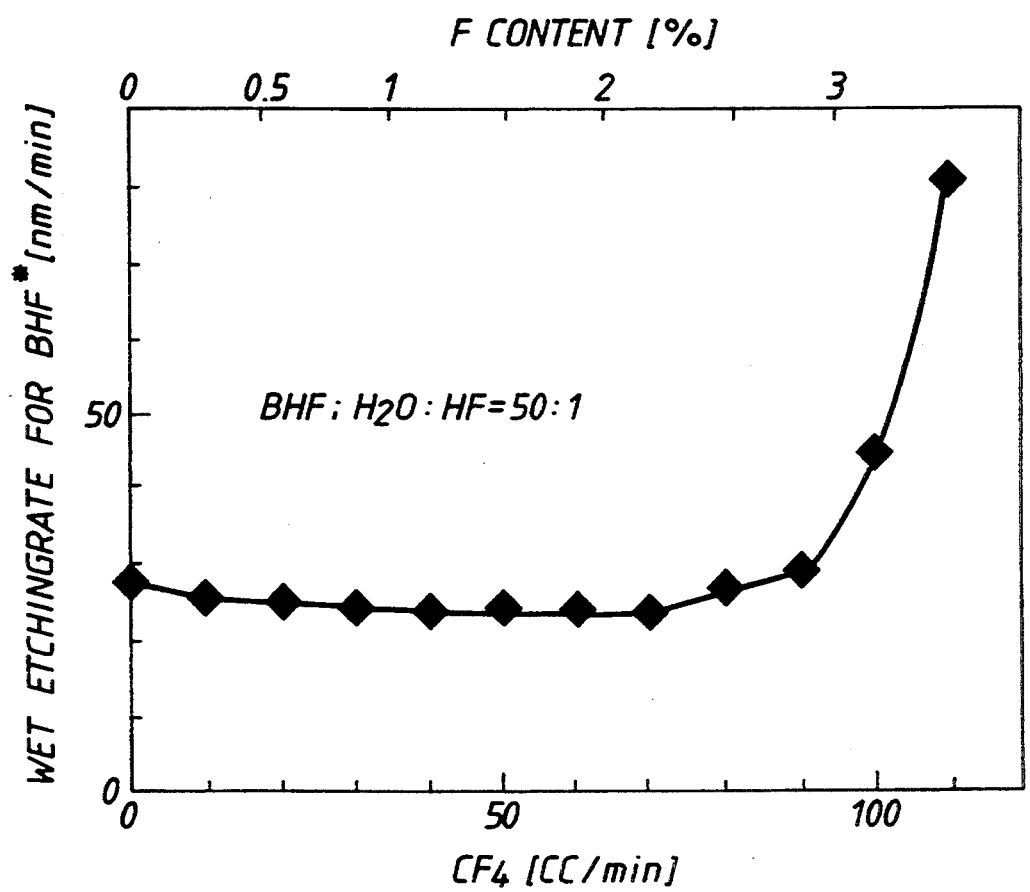
FIG. 9 shows a relation between a $CF_4$ flow rate (fluorine content (%) in silicon oxide film) and a wet etching rate for BHF (buffered hydrofluoric acid).

FIG. 9 shows a relation between a CF$_4$ flow rate (fluorine content (vol %) in silicon oxide film) and a wet etching rate for BHF.

when a fluorine content was higher than 3.0 vol %, a wet etching rate for BHF increased remarkably in comparison with low ones at not more than 3.0 vol %. This phenomenon is realized by a change in the film quality of the silicon oxide films. Namely, the silicon oxide films formed by this method get to have porous structures as a result of a reaction under the existence of fluorine, and thus the porous structures accelerate the etching rate.

Considering the results of the above analysis, a preferable content (roll) of fluorine contained in the silicon oxide films formed by the present invention is as follows.

$$0.5 \leq Q \leq 3.0, \text{ more preferably } 0.5 \leq Q \leq 2.5.$$

The results described above can be applied to other methods according to the present invention, for example a method employing a plasma enhanced CVD.

Numerous modifications and variations of the present invention are possible in light of the above teachings. It is therefore to be understood that, within the scope of the appended claims, the present invention can be practiced in a manner other than as specifically described herein.

What is claimed is:

1. A method of manufacturing semiconductor devices, comprising the steps of:
    arranging at least one substrate in a reaction vessel;
    decomposing a gas including at least one halogen into halogen radicals;
    supplying an organic silane compound gas, an ozone gas, and said gas including at least one halogen decomposed into halogen radicals into said reaction vessel; and
    forming a silicon oxide film, including said at least one halogen, on said substrate by heating an inner portion of said reaction vessel to a predetermined temperature, while decreasing exhausted products to levels at which reliability of said silicon oxide film is not impaired.

2. A method of manufacturing semiconductor devices according to claim 1, wherein said decomposing step is a step of decomposing said gas including at least one halogen by microwave discharge.

3. A method of manufacturing semiconductor devices according to claim 1, further comprising the step of forming an ozone gas by silent discharge of an oxygen gas.

4. A method of manufacturing semiconductor devices according to claim 3, wherein said decomposing step includes a step of subjecting said gas including at least one kind of halogen to said silent discharge with said oxygen gas.

5. A method of manufacturing semiconductor devices according to claim 1, wherein said decomposing step is a step of decomposing said gas including at least one kind of halogen by heating thereof at a predetermined temperature.

6. A method of manufacturing semiconductor devices according to claim 5, wherein said gas including at least one halogen is a gas including at least one of an interhalogen compound and a compound comprising a halogen and a noble gas element.

7. A method of manufacturing semiconductor devices according to claim 1, wherein said gas including at least one halogen is a gas including fluorine.

8. A method of manufacturing semiconductor devices according to claim 7, wherein said gas including fluorine is at least one gas selected from the group consisting of carbon tetrafluoride gas, nitrogen trifluoride gas, fluorine gas, sulfer hexafluoride gas, and monohydrocarbon trifluoride.

9. A method of manufacturing semiconductor devices according to claim 1, further comprising a step of supplying to said reaction vessel a gas including at least one element selected from the group consisting of boron, phosphorus, and arsenic, whereby a silicon oxide film including at least one element selected from the group consisting of boron, phosphorus, and arsenic is formed on said substrate.

10. A method of manufacturing semiconductor devices, comprising the steps of:
arranging at least one substrate in a reaction vessel;
decomposing a gas including at least one halogen into halogen radicals;
supplying an organic silane compound gas, an ozone gas, and said gas including at least one halogen decomposed into halogen radicals to said reaction vessel;
forming a silicon oxide film, including said at least one halogen, on said substrate by heating an inner portion of said reaction vessel to a predetermined temperature, while decreasing exhausted products to levels at which reliability of said silicon oxide film is not impaired; and
forming a conductive layer on said silicon oxide film.

11. A method of manufacturing semiconductor devices according to claim 1, wherein said gas including at least one halogen is a gas including fluorine, and a content Q (vol %) of fluorine contained in said silicon oxide film is $0.5 \leq Q \leq 3.0$.

* * * * *